United States Patent
Jung et al.

(10) Patent No.: US 11,672,168 B2
(45) Date of Patent: Jun. 6, 2023

(54) LIGAND FOR SURFACE MODIFICATION, LIGHT EMITTING ELEMENT INCLUDING THE SAME, AND METHOD FOR MANUFACTURING DISPLAY DEVICE

(71) Applicant: Samsung Display Co., Ltd., Yongin-si (KR)

(72) Inventors: YunKu Jung, Cheonan-si (KR); YunHyuk Ko, Asan-si (KR); HyoJin Ko, Seoul (KR); DukKi Kim, Suwon-si (KR); JunBo Sim, Suwon-si (KR); JaeKook Ha, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 149 days.

(21) Appl. No.: 17/222,901

(22) Filed: Apr. 5, 2021

(65) Prior Publication Data
US 2021/0359229 A1 Nov. 18, 2021

(30) Foreign Application Priority Data
May 18, 2020 (KR) .......................... 10-2020-0058822

(51) Int. Cl.
| H01L 51/00 | (2006.01) |
| C07F 7/08 | (2006.01) |
| C07F 9/38 | (2006.01) |
| H01L 51/52 | (2006.01) |
| H01L 51/56 | (2006.01) |

(52) U.S. Cl.
CPC ........ *H01L 51/0094* (2013.01); *C07F 7/0834* (2013.01); *C07F 9/3817* (2013.01); *H01L 51/005* (2013.01); *H01L 51/5237* (2013.01); *H01L 51/56* (2013.01)

(58) Field of Classification Search
CPC .............. H01L 51/0094; H01L 51/005; C07F 7/0834; C07F 9/3817
See application file for complete search history.

(56) References Cited

U.S. PATENT DOCUMENTS

| 10,439,155 | B2 | 10/2019 | Park et al. |
| 2014/0124802 | A1 | 5/2014 | Do et al. |
| 2019/0025696 | A1 | 1/2019 | Chae et al. |
| 2019/0276734 | A1 | 9/2019 | Kim et al. |
| 2020/0172802 | A1 | 6/2020 | Ahn et al. |
| 2020/0403118 | A1 | 12/2020 | Kim et al. |
| 2021/0202800 | A1 | 7/2021 | Jung et al. |

FOREIGN PATENT DOCUMENTS

| KR | 10-1542504 | 8/2015 |
| KR | 10-1828214 | 2/2018 |
| KR | 10-2018-0059363 | 6/2018 |
| KR | 10-2019-0029193 | 3/2019 |
| KR | 10-2019-0106819 | 9/2019 |
| KR | 10-2020-0026679 | 3/2020 |
| WO | 2020/040368 | 2/2020 |

OTHER PUBLICATIONS

Extended European search report for European Patent Application or Patent No. 21172447.1 dated Oct. 22, 2021.

*Primary Examiner* — Anthony Ho
(74) *Attorney, Agent, or Firm* — Kile Park Reed & Houtteman PLLC

(57) ABSTRACT

A light emitting element includes: a member including a semiconductor layer and an active layer; and at least one ligand bonded to a surface of the member; wherein the at least one ligand includes: a first ligand including two or more functional group chains; and a second ligand having a shorter carbon length than the first ligand.

20 Claims, 11 Drawing Sheets

LIGAND FOR SURFACE MODIFICATION, LIGHT EMITTING ELEMENT INCLUDING THE SAME, AND METHOD FOR MANUFACTURING DISPLAY DEVICE

CROSS-REFERENCE TO RELATED APPLICATION

This application claims priority from and the benefit of Korean Patent Application No. 10-2020-0058822, filed on May 18, 2020, which is hereby incorporated by reference for all purposes as if fully set forth herein.

BACKGROUND

Field

Exemplary embodiments of the invention relate generally to a ligand for surface modification, a light emitting element including the same, and a method for manufacturing a display device, and more particularly, to a ligand for surface modification capable of improving manufacturing yield and reliability of a light emitting element, a light emitting element including the same, and a method for manufacturing a display device.

Discussion of the Background

A light emitting diode (LED) serves as an element converting an electrical signal into forms of light, such as infrared light and visible light, using compound semiconductor properties. The LED is used in home appliances, remote controls, electronic displays, and various automated devices. The fact that light emitting diodes are applied to a wide range of electric devices from small-sized handheld electronic devices to large-sized display devices suggests that use of light emitting diodes is gradually expanding.

As part of research to make use of light emitting diodes, technology for manufacturing subminiature light emitting diodes, such as micro- or nano-scaled light emitting diodes, is being developed. An elongate light emitting diode, for example, may be manufactured in a small size for suitable use in pixels of a self-luminescent display panel.

The above information disclosed in this Background section is only for understanding of the background of the inventive concepts, and, therefore, it may contain information that does not constitute prior art.

SUMMARY

Light emitting elements having a modified surface including a ligand made according to the principles and exemplary implementations of the invention are capable of improving dispersibility on a surface of a light emitting element member. Methods for manufacturing a display device according to the principles and exemplary implementations of the invention have improved reliability and manufacturing yield include a light emitting element having a modified surface property.

Additional features of the inventive concepts will be set forth in the description which follows, and in part will be apparent from the description, or may be learned by practice of the inventive concepts.

According to one aspect of the invention, a light emitting element includes: a member including a semiconductor layer and an active layer; and at least one ligand bonded to a surface of the member; wherein the at least one ligand includes: a first ligand including two or more functional group chains; and a second ligand having a shorter carbon length than the first ligand.

The member may include a body, and the first ligand may include: a first head bonded to the surface of the body; an intermediate chain linked to the first head; a functional group linker linked to an end of the intermediate chain; and the two or more functional group chains linked to the functional group linker, and the second ligand includes: a second head bonded to the surface of the body; and a chain linked to the second head.

The first head and the second head each, independently from one another, may include at least one of a hydroxy group, a thiol group, a catechol group, a siloxane group, a phosphonic acid group, an amine group, or a carboxy group.

The chain and the two or more group chains each, independently from one another, may include a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms.

The first ligand may be represented by Formula 1 below:

Formula 1 wherein in Formula 1 above, the variables are defined herein.

The first ligand may be represented by Formula 1-1 or Formula 1-2 below:

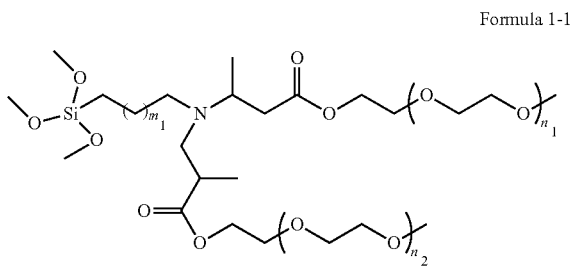

Formula 1-1

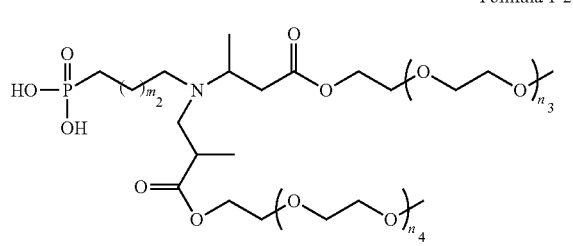

Formula 1-2 wherein in Formulas 1-1 and 1-2 above, the variables are defined herein.

The second ligand may be represented by Formula 2 below:

Formula 2 wherein in Formula 2 above, the variables are defined herein.

The second ligand may be represented by Formula 2-1 or Formula 2-2 below:

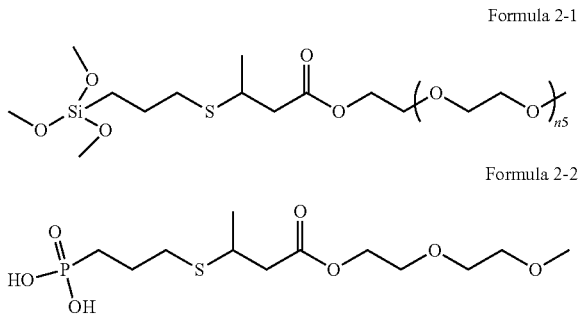

Formula 2-1

Formula 2-2 wherein in Formulas 2-1 and 2-2 above, the variables are defined herein.

The semiconductor layer may include a first semiconductor layer, and a second semiconductor layer spaced apart from the first semiconductor layer with the active layer therebetween.

The member may further include a first contact electrode disposed adjacent to the first semiconductor layer, and a second contact electrode disposed adjacent to the second semiconductor layer.

The member may further include an insulating film covering side portions of the semiconductor layer and the active layer, and a metal oxide.

The ligand may be bonded to the insulating film.

The member may include a body having a plurality of first bonding positions to which the first ligand may be bonded, and a plurality of second bonding positions to which the second ligand may be bonded, wherein at least any one of the plurality of second bonding positions may be disposed between a pair of adjacent first bonding positions of the plurality of first bonding positions.

The length of the body may be about 1 μm to about 100 μm.

According to another aspect of the invention, a ligand for a light emitting element includes: a head; an intermediate chain linked to the head; a functional group linker linked to an end of the intermediate chain; and two or more functional group chains linked to the functional group linker, wherein the two or more functional group chains each, independently from one another, include a substituted or unsubstituted amine group, a substituted or unsubstituted oxy group, a substituted or unsubstituted thio group, a substituted or unsubstituted ester group, a substituted or unsubstituted amide group, a substituted unsubstituted alkyl group having 1 to 20 carbon atoms, or a substituted or unsubstituted aryl group having 6 to 30 ring-forming carbon atoms.

The ligand may be represented by Formula 1 below:

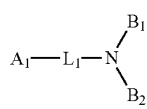

Formula 1 wherein in Formula 1 above, the variables are defined herein.

The first ligand may be represented by Formula 1-1 or Formula 1-2 below:

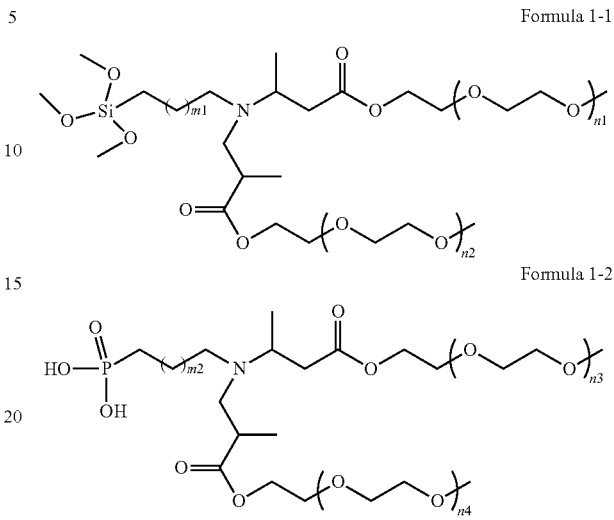

Formula 1-1

Formula 1-2 wherein in Formulas 1-1 and 1-2 above, the variables are defined herein.

According to a further aspect of the invention, a method for manufacturing a display device includes the steps of: forming a circuit layer on a base layer; forming a first electrode and a second electrode on the circuit layer; providing a plurality of light emitting elements and a solution including a solvent on the first electrode and the second electrode; and vaporizing the solvent, wherein each of the plurality of light emitting elements includes: a member having a semiconductor layer and an active layer; and at least one ligand bonded to a surface of the member, and the at least one ligand includes: a first ligand having two or more functional group chains, and a second ligand having a shorter carbon length than the first ligand.

The solvent may be at least substantially water-soluble.

The two or more functional group chains each, independently from one another, may include a substituted or unsubstituted amine group, a substituted or unsubstituted oxy group, a substituted or unsubstituted thio group, a substituted or unsubstituted ester group, a substituted or unsubstituted amide group, a substituted unsubstituted alkyl group having 1 to 20 carbon atoms, or a substituted or unsubstituted aryl group having 6 to 30 ring-forming carbon atoms.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
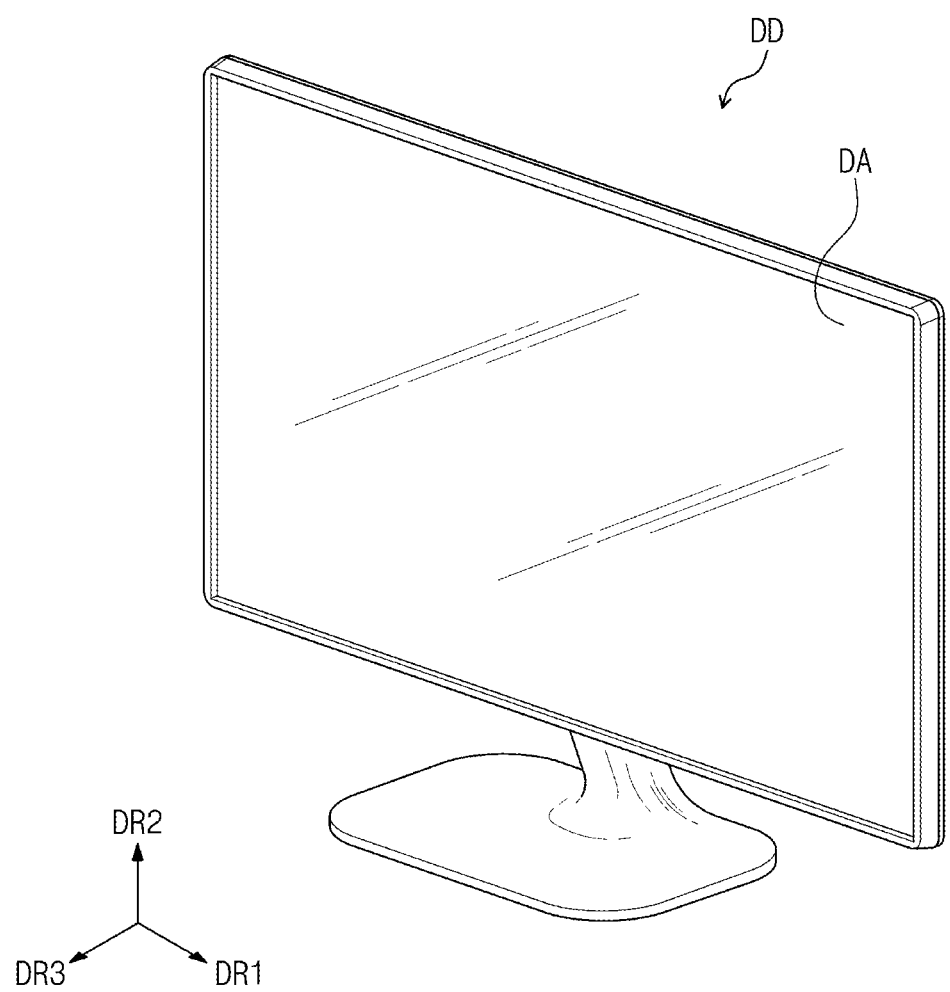
FIG. 1 is a perspective view of an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, combinations, and/or groups thereof, but do not preclude the presence or addition of one or more other features, integers, steps, operations, elements, components, combinations, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of an exemplary embodiment of a display device constructed according to principles of the invention.

Referring to FIG. 1, a display device DD may display an image through a display area DA. FIG. 1 exemplarily illustrates that the display area DA is provided in a face defined by a first direction DR1 and a second direction DR2 intersecting the first direction DR1. In some exemplary embodiments, however, the display area of the display device may have a generally curved face.

The thickness direction of the display device DD is indicated by a third direction DR3. The directions indicated by the first to third directions DR1, DR2, and DR3 are relative concepts, and may thus be changed to other directions. As used herein, the term "when viewed in plan" may refer to a case viewed from the third direction DR3. In addition, the "thickness direction" may indicate the third direction DR3.

FIG. 1 exemplarily illustrates that the display device DD is a television set. However, the display device DD may also be used not only for large-sized electronic devices such as a monitor or an outdoor billboard, but also for small- and medium-sized electronic devices such as a personal computer, a laptop computer, a personal digital terminal, a car navigation unit, a game console, a smartphone, a tablet, and a camera. In addition, these are merely presented as examples, and thus the display device DD may take the form of or be adopted for use in other electronic devices as well.

Figure 2:
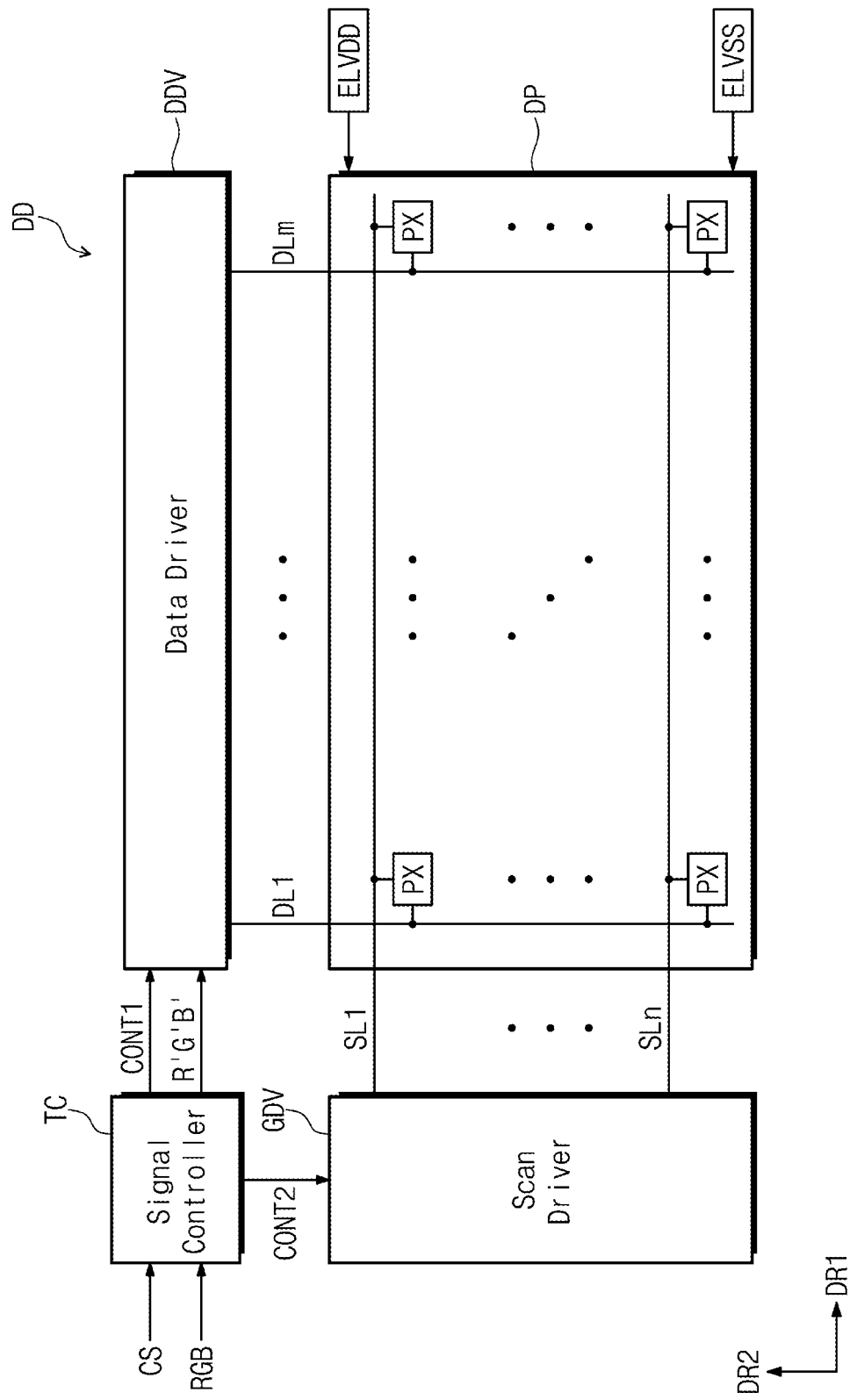
FIG. 2 is a block diagram of an exemplary embodiment of the display device of FIG. 1.

FIG. 2 is a block diagram of an exemplary embodiment of the display device of FIG. 1.

Referring to FIG. 2, the display device DD may include a display panel DP, a signal controller TC or a timing controller, a data driver DDV, and a scan driver GDV. The signal controller TC, the data driver DDV, and the scan driver GDV each may include a circuit. The display panel DP may be a subminiature light emitting element display panel DP including a subminiature light emitting element. For example, the display panel DP may be a micro LED display panel DP.

The display panel DP may include a plurality of scan lines SL1-SLn, a plurality of data lines DL1-DLm, and a plurality of pixels PX. The plurality of scan lines SL1-SLn may extend in the first direction DR1 and be arranged along the second direction DR2 intersecting the first direction DR1. The plurality of data lines DL1-DLm may extend in the second direction DR2 and be arranged along the first direction DR1.

The pixels PX each may include a light emitting element and a pixel circuit electrically connected to the light emitting element. The pixel circuit may include a plurality of transistors. A first power voltage ELVDD and a second power voltage ELVSS may be provided to each of the pixels PX.

The pixels PX may be disposed according to a predetermined rule on a plane of the display panel DP. The pixels PX each may display one of primary colors or one of mixed colors. The primary colors may include red, green, and blue, and the mixed colors may include various colors such as yellow, cyan, magenta, and white. However, colors displayed by the pixels PX are not limited thereto.

The signal controller TC receives image data RGB provided from the outside. The signal controller TC converts the image data RGB to conform to the operation of the display panel DP so as to generate converted image data R'G'B', and output the converted image data R'G'B' to the data driver DDV.

In addition, the signal controller TC may receive a control signal CS provided from the outside. The control signal CS may include a vertical synchronization signal, a horizontal synchronization signal, a main clock signal, and a data enable signal. The signal controller TC provides a first control signal CONT1 to the data driver DDV, and provides a second control signal CONT2 to the scan driver GDV. The first control signal CONT1 is a signal for controlling the data driver DDV, and the second control signal CONT2 is a signal for controlling the scan driver GDV.

The data driver DDV may provide an electrical signal to the plurality of data lines DL1-DLm in response to the first control signal CONT1 received from the signal controller TC. The data driver DDV may be implemented as an independent integrated circuit to be electrically connected to one side of the display panel DP, or to be directly mounted on the display panel DP. In addition, the data driver DDV may be implemented as a single chip, or may include a plurality of chips.

The scan driver GDV may provide an electrical signal to the scan lines SL1-SLn in response to the second control signal CONT2 received from the signal controller TC. The scan driver GDV may be integrated in a predetermined area of the display panel DP. For example, the scan driver GDV may include a plurality of thin film transistors formed through the same process as the driving circuit of the pixels PX, for example, a low temperature polycrystalline silicon (LTPS) process or a low temperature polycrystalline oxide (LTPO) process. In addition, in another exemplary embodiment, the scan driver GDV may be implemented as an independent integrated circuit chip to be electrically connected to one side of the display panel DP.

While a gate-on voltage is applied to one of the plurality of scan lines SL1-SLn, a switching transistor of each of the pixels of one row connected thereto is turned on. In this case, the data driver DDV provides data driving signals to the data lines DL1-DLm. The data driving signals supplied to the data lines DL1-DLm are applied to the corresponding pixels through the turned-on switching transistors. The data driving signals may be analog voltages corresponding to gray-scale values of image data.

Figure 3:
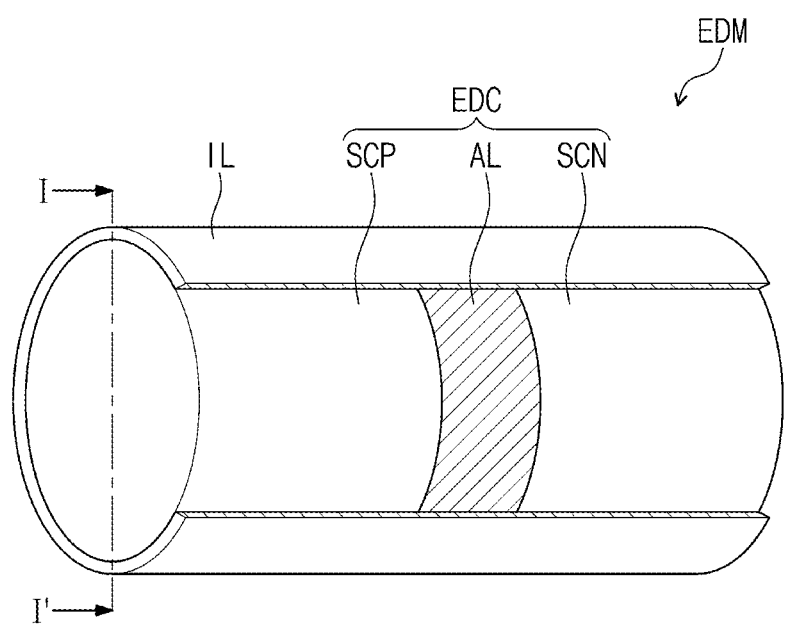
FIG. 3 is a perspective view illustrating an exemplary embodiment of a part of a light emitting element constructed according to principles of the invention.
Figure 4A:
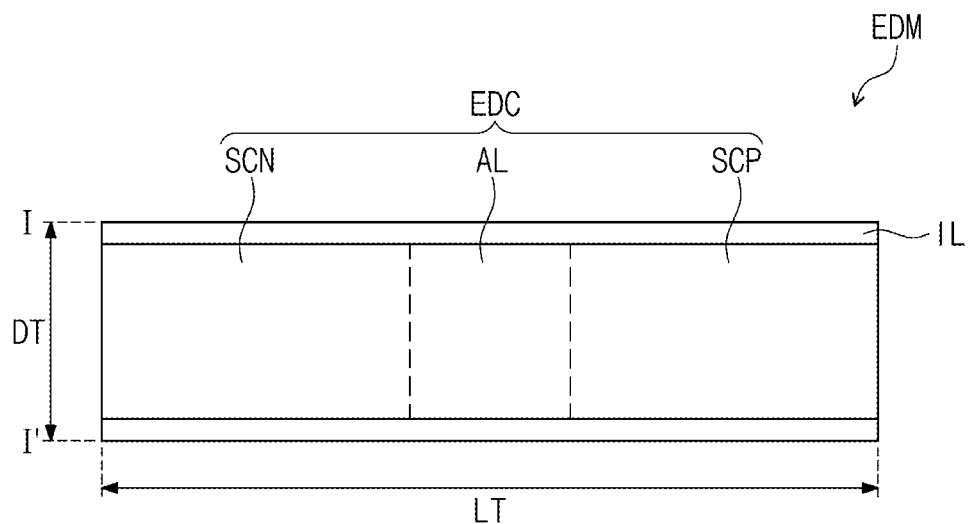
FIGS. 4A to 4C are cross-sectional views taken along I-I' of FIG. 3 illustrating exemplary embodiments of the light emitting element.
Figure 4B:
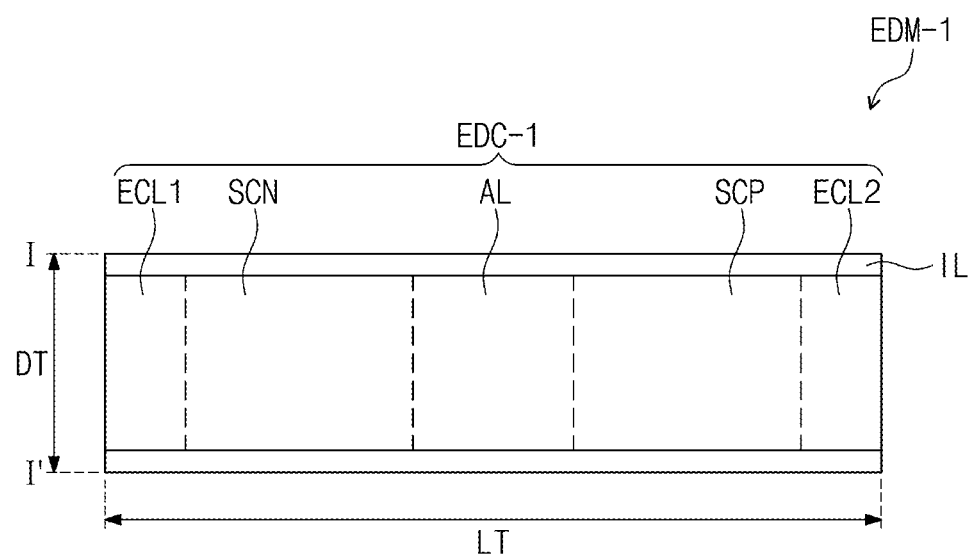
Figure 4C:
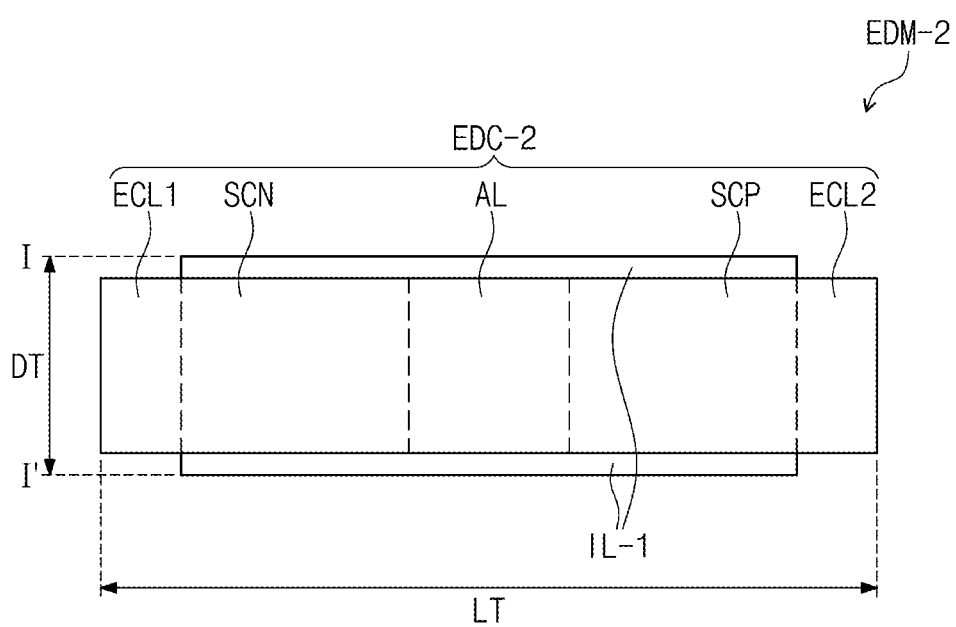

FIG. 3 is a perspective view illustrating an exemplary embodiment of a part of a light emitting element constructed according to principles of the invention. FIGS. 4A to 4C are cross-sectional views taken along I-I' of FIG. 3 illustrating exemplary embodiments of the light emitting element. FIGS. 3 and 4A to 4C illustrate configuration of a body EDM of a light emitting element according to some exemplary embodiments.

The light emitting element may be any structure capable of emitting light. According to some exemplary embodiments, the light emitting element may be a subminiature LED element. The subminiature LED element may be an LED element having a length between several nanometers and several hundred micrometers. However, the length of the subminiature LED element is described merely as an example, the length of the subminiature LED element is not limited to the above numerical range.

Referring to FIG. 3, the light emitting element according to some exemplary embodiments includes a member that may be in the form of a body having various shapes such as a generally cylindrical shape or a generally polygonal column shape. Although FIG. 3 exemplarily illustrates that the body EDM of the light emitting element is a generally cylindrical LED element, the exemplary embodiments are not limited thereto, and the body EDM of the light emitting element may have various generally polygonal columnar shapes including a generally rectangular parallel-piped shape. The body EDM may have a generally elongate shape in the longitudinal direction.

Referring to FIGS. 3 and 4A, the body EDM of the light emitting element includes semiconductor layers SCP and SCN and an active layer AL. The body EDM may include a core portion EDC having a first semiconductor layer SCN, a second semiconductor layer SCP, and an active layer AL. The active layer AL may be disposed between the first semiconductor layer SCN and the second semiconductor layer SCP. The body EDM may further include an insulating film IL covering a side of the core portion EDC including the semiconductor layers SCP and SCN, and the active layer AL. FIG. 3 exemplarily illustrates that, for convenience of description, the insulating film IL exposes a part of a side of the core portion EDC, and covers the remaining part as an example, but the insulating film IL is not limited thereto, and may cover the whole side of the core portion EDC. In other words, the side of the core portion EDC included in the body EDM of the light emitting element may be fully covered by the insulating film IL, in which case it is not be exposed to the outside.

The first semiconductor layer SCN may be an n-type semiconductor layer provided by being doped with an n-type dopant in the semiconductor layer. The second semiconductor layer SCP may be a p-type semiconductor layer provided by being doped with a p-type dopant in the semiconductor layer. The semiconductor layer may include a semiconductor material, and the semiconductor material may be, for example, GaN, AlN, AlGaN, InGaN, InN, InAlGaN, or AlInN, but is not limited thereto. The n-type dopant may be silicon (Si), germanium (Ge), tin (Sn), selenium (Se), tellurium (Te), or a combination thereof, but is not limited thereto. The p-type dopant may be magnesium (Mg), zinc (Zn), calcium (Ca), strontium (Sr), or barium (Ba), or a combination thereof, but is not limited thereto.

The active layer AL may be formed of at least one of a single quantum well structure, a multi quantum well structure, a quantum wire structure, or a quantum dot structure. The active layer AL may be an area in which electrons injected through the first semiconductor layer SCN and holes injected through the second semiconductor layer SCP are recombined. The active layer AL is a layer emitting light having energy determined by an intrinsic energy band of a material. The location of the active layer AL may variously change according to the type of a diode.

The first semiconductor layer SCN may be connected to one of a first electrode E1 (see FIG. 7) and a second electrode E2 (see FIG. 7), and the second semiconductor layer SCP may be connected to the other one of the first electrode E1 and the second electrode E2. The body EDM may have a length LT between several hundred nanometers and several hundred micrometers. The length LT of the body EDM may be, for example, between about 1 μm and about 100 μm.

The body EDM may have a width DT between several nanometers and several micrometers. The width DT of the body EDM may be, for example, between about 100 nm and about 1 μm. The ratio of the length LT to the width DT of the body EDM, that is, the aspect ratio may be between about 1:5 and about 1:10.

The insulating film IL may cover sides of the first semiconductor layer SCN, the second semiconductor layer SCP, and the active layer AL, and may protect outer surfaces of the first semiconductor layer SCN, the second semiconductor layer SCP, and the active layer. In another exemplary embodiment, the insulating film IL may cover only the active layer AL. The insulating film IL may include a metal oxide. For example, the insulating film IL may include at least one insulating material selected from the group consisting of a $SiO_2$, a $Si_3N_4$, an $Al_2O_3$, and a $TiO_2$, but is not limited thereto.

Referring to FIG. 4B, a body EDM-1 may further include a first contact electrode ECL1 and a second contact electrode ECL2 when compared to the body EDM of FIG. 4A. That is, a core portion EDC-1 may include the first semiconductor layer SCN, the active layer AL, the second semiconductor layer SCP, the first contact electrode ECL1, and the second contact electrode ECL2.

The first contact electrode ECL1 may be adjacent to the first semiconductor layer SCN, and the second contact electrode ECL2 may be adjacent to the second semiconductor layer SCP. For example, the first contact electrode ECL1, the first semiconductor layer SCN, the active layer AL, the second semiconductor layer SCP, and the second contact electrode ECL2 may be sequentially disposed.

The first contact electrode ECL1 and the second contact electrode ECL2 each may be formed of a metal or an alloy of metals. For example, the first contact electrode ECL1 and the second contact electrode ECL2 each may be formed of any one metal or an alloy of the metals selected from molybdenum (Mo), chromium (Cr), nickel (Ni), gold (Au), aluminum (Al), and titanium (Ti), platinum (Pt), vanadium (V), tungsten (W), lead (Pd), copper (Cu), rhodium (Rh), or iridium (Ir). The first contact electrode ECL1 and the second contact electrode ECL2 may include the same material or different materials. The first contact electrode ECL1 and the second contact electrode ECL2 each may be electrically connected to a corresponding one of the first electrode E1 (see FIG. 7) or the second electrode E2 (see FIG. 7).

Referring to FIG. 4C, a body EDM-2 may include an insulating film IL-1 having a different shape when compared to the body EDM-1 of FIG. 4B. The insulating film IL-1 may cover the first semiconductor layer SCN, the second semiconductor layer SCP, and the active layer AL, and may not cover the first contact electrode ECL1 and the second contact electrode ECL2. However, the exemplary embodiments are not limited thereto, and in another exemplary embodiment, the insulating film IL-1 may cover at least a part of the first contact electrode ECL1 and the second contact electrode ECL2 or may cover both the first contact electrode ECL1 and the second contact electrode ECL2.

Figure 5A:
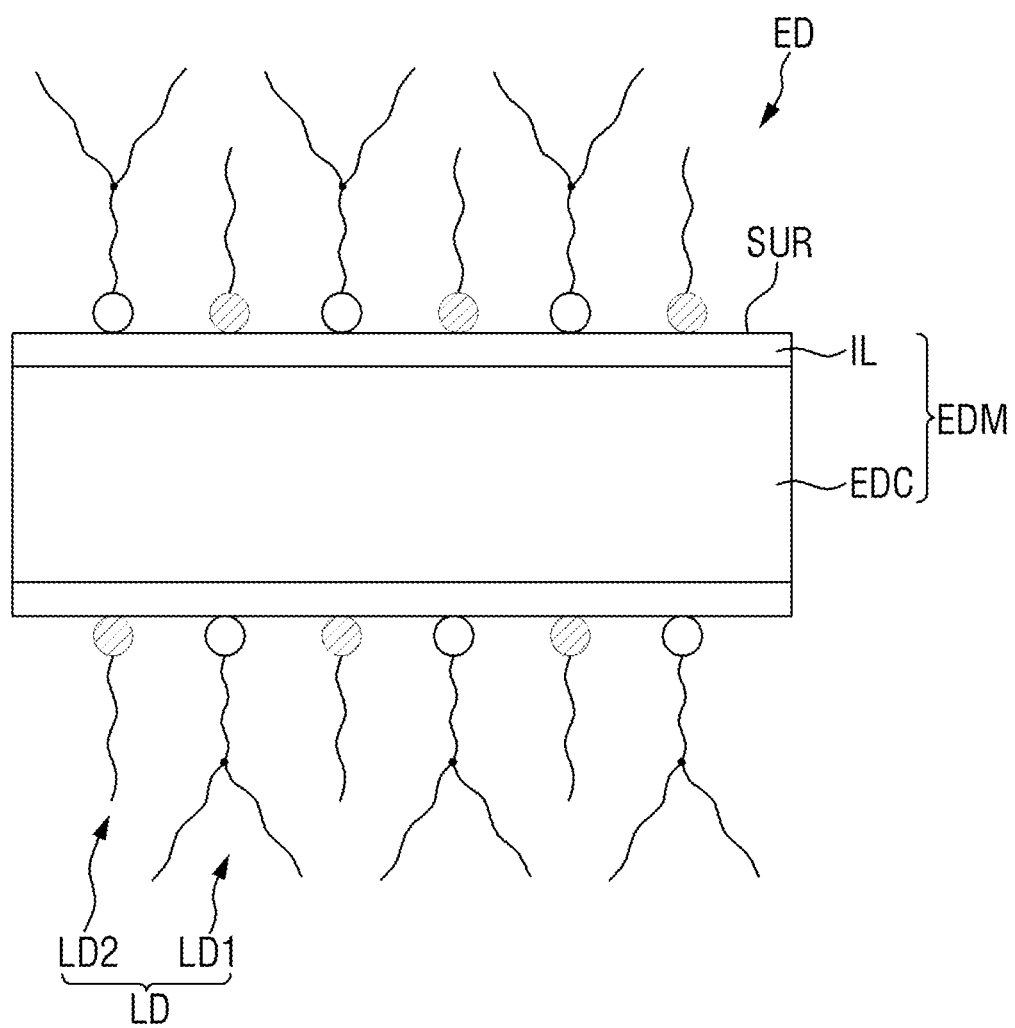
FIGS. 5A and 5B are cross-sectional views of an exemplary embodiment of a light emitting element constructed according to principles of the invention.
Figure 5B:
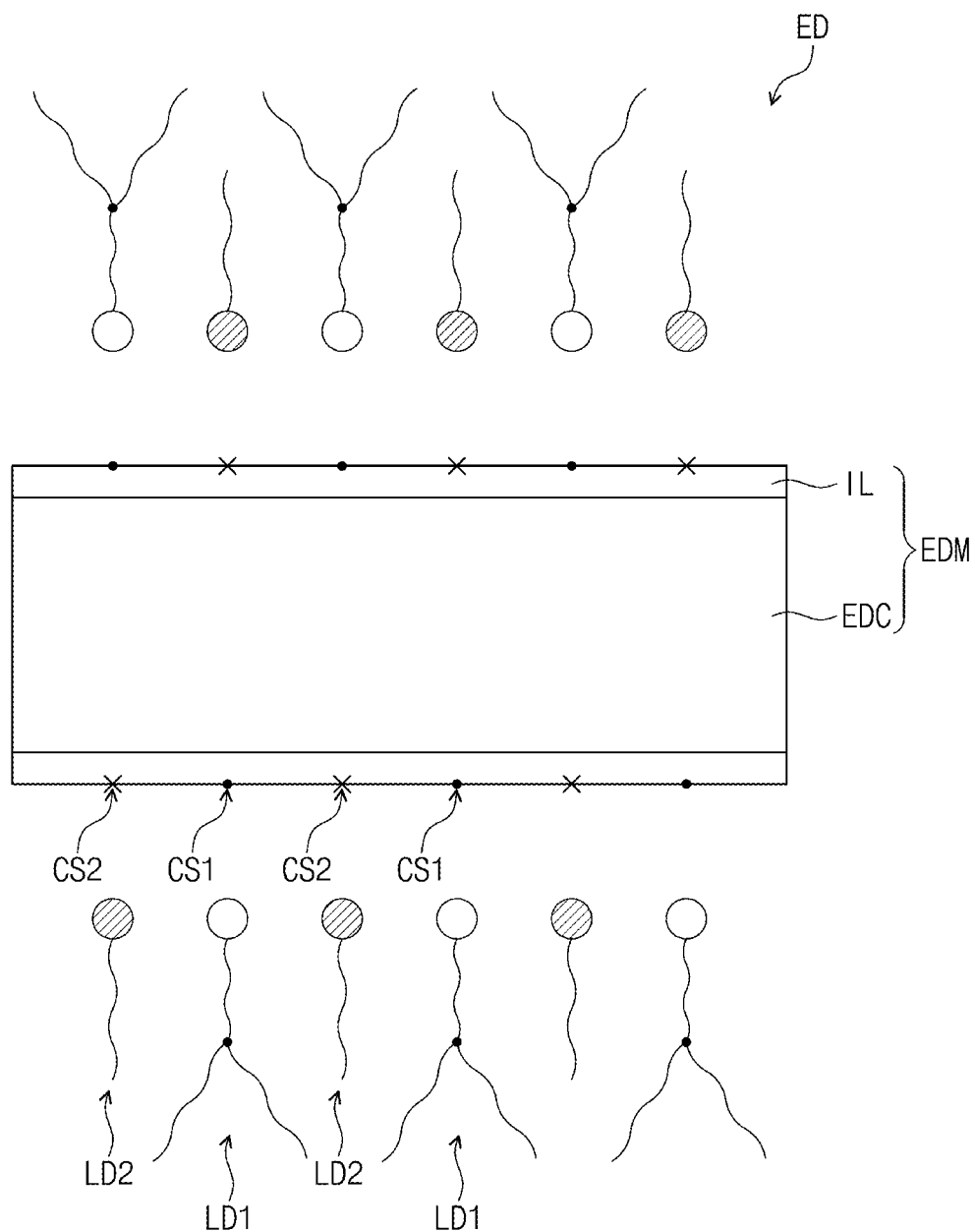

FIGS. 5A and 5B are cross-sectional views of an exemplary embodiment of a light emitting element constructed according to principles of the invention. FIG. 5B, for convenience of description, illustrates a cross-sectional view of ligands separated from a light emitting element body.

Referring to FIG. 5A, a light emitting element ED includes a body EDM and at least one ligand LD which may be in the form of a plurality of ligands LD1 and LD2 bonded to a surface of the body EDM. The body EDM may include a core portion EDC and an insulating film IL covering the core portion EDC and a side of the core portion EDC. Hereinafter, the same descriptions of the bodies EDM, EDM-1, and EDM-2 described above in FIGS. 4A to 4C may be applied to descriptions on the body EDM in FIG. 5A.

The plurality of ligands LD1 and LD2 may be bonded to a surface SUR of the body EDM of the light emitting element ED, and in particular, to a surface of the insulating film IL. The first ligand LD1 includes two or more functional group chains, and the second ligand LD2 may have a shorter total carbon length than the first ligand LD1. Hereinafter, the first ligand LD1 and the second ligand LD2 will be described in more detail in FIGS. 6A and 6B which will be described later.

The body EDM of the light emitting element ED includes a first bonding position CS1 to which the first ligand LD1 is bonded, and a second bonding position CS2 to which the second ligand LD2 is bonded. Each of the first bonding position CS1 and the second bonding position CS2 may be provided in plural to correspond to the number of each of the first ligand LD1 and the second ligand LD2. In an exemplary embodiment, at least one second bonding position CS2 may be disposed between a pair of adjacent first bonding positions CS1 of the plurality of first bonding positions CS1. FIGS. 5A and 5B exemplarily illustrate that one second bonding position CS2 is disposed between a pair of adjacent first bonding positions CS1, but is not limited thereto, and two or more second bonding positions CS2 may be defined between a pair of adjacent first bonding positions CS1.

FIGS. 5A and 5B exemplarily illustrate that the first ligand LD1 and the second ligand LD2 each are bonded to the body EDM of the light emitting element ED in the same ratio, but the exemplary embodiments are not limited thereto, and the ratio that each of the first ligand LD1 and the second ligand LD2 is bonded may be different. In an exemplary embodiment, the ratio of the first ligand LD1 to the total ligand may be about 30% to about 70%. In an exemplary embodiment, the ratio of the second ligand LD2 to the total ligand may be about 30% to about 70%. The first ligand LD1 may be bonded to the body EDM at a higher ratio than the second ligand LD2.

Figure 6A:
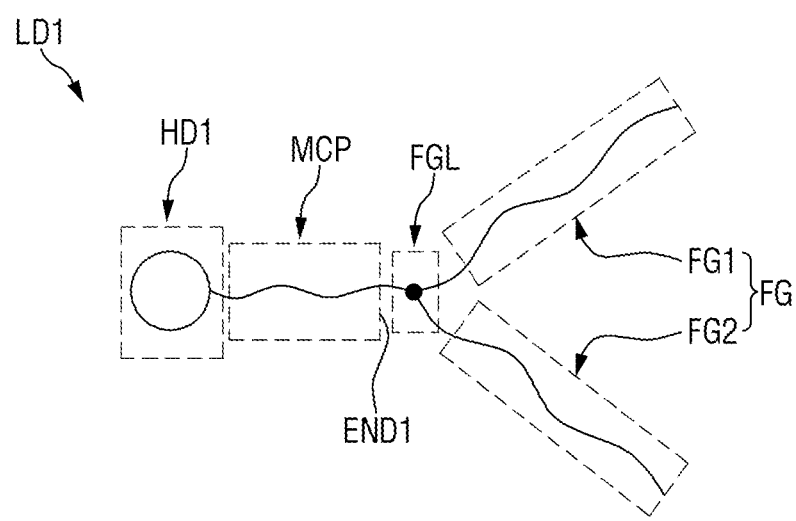
FIG. 6A is a schematic view showing an exemplary embodiment of a first ligand constructed according to principles of the invention.
Figure 6B:
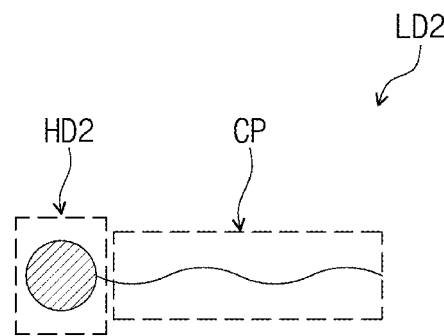
FIG. 6B is a schematic view showing an exemplary embodiment of a second ligand constructed according to principles of the invention.

FIG. 6A is a schematic view showing an exemplary embodiment of a first ligand constructed according to principles of the invention. FIG. 6B is a schematic view showing an exemplary embodiment of a second ligand constructed according to principles of the invention. Hereinafter, a ligand LD1 or LD2 will be described with reference to FIGS. 6A and 6B.

As used herein, the term "substituted or unsubstituted" may indicate that one is substituted or unsubstituted with at least one substituent selected from the group consisting of a deuterium atom, a halogen atom, a cyano group, a nitro group, an amine group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents exemplified above may be substituted or unsubstituted. For example, a biphenyl group may be interpreted as an aryl group or as a phenyl group substituted with a phenyl group.

As used herein, an alkyl group may be a linear, branched or cyclic type. The number of carbon atoms in the alkyl group is 1 to 50, 1 to 30, 1 to 20, 1 to 10, or 1 to 6. Examples of the alkyl group may include a methyl group, an ethyl group, an n-propyl group, an isopropyl group, an n-butyl group, a s-butyl group, a t-butyl group, an i-butyl group, a 2-ethylbutyl group, a 3,3-a dimethylbutyl group, an n-pentyl group, an i-pentyl group, a neopentyl group, a t-pentyl group, a cyclopentyl group, a 1-methylpentyl group, a 3-methylpentyl group, a 2-ethylpentyl group, a 4-methyl-2-pentyl group, an n-hexyl group, a 1-methylhexyl group, a 2-ethylhexyl group, a 2-butylhexyl group, a cyclohexyl group, a 4-methylcyclohexyl group, a 4-t-butylcyclohexyl group, an n-heptyl group, a 1-methylheptyl group, a 2,2-dimethylheptyl group, a 2-ethylheptyl group, a 2-butylheptyl group, an n-octyl group, a t-octyl group, a 2-ethyloctyl group, a 2-butyloctyl group, a 2-hexyloctyl group, a 3,7-dimethyloctyl group, a cyclooctyl group, an n-nonyl group, an n-decyl group, an adamantyl group, a 2-ethyldecyl group, a 2-butyldecyl group, a 2-hexyldecyl group, a 2-octyldecyl group, an n-undecyl group, an n-dodecyl group, a 2-ethyldodecyl group, a 2-butyldodecyl group, a 2-hexyldocecyl group, a 2-octyldodecyl group, an n-tridecyl group, an n-tetradecyl group, an n-pentadecyl group, an n-hexadecyl group, a 2-ethylhexadecyl group, a 2-butylhexadecyl group, a 2-hexylhexadecyl group, a 2-octylhexadecyl group, an n-heptadecyl group, an n-octadecyl group, an n-nonadecyl group, an n-eicosyl group, a 2-ethyleicosyl group, a 2-butyleicosyl group, a 2-hexyleicosyl group, a 2-octyleicosyl group, an n-henicosyl group, an n-docosyl group, an n-tricosyl group, an n-tetracosyl group, an n-pentacosyl group, an n-hexacosyl group, an n-heptacosyl group, an n-octacosyl group, an n-nonacosyl group, an n-triacontyl group, etc., but the exemplary embodiments are not limited thereto.

As used herein, a hydrocarbon ring includes an aliphatic hydrocarbon ring and an aromatic hydrocarbon ring. A heterocycle includes an aliphatic heterocycle and an aromatic heterocycle. The hydrocarbon ring and the heterocycle may be monocyclic or polycyclic.

As used herein, a hydrocarbon ring group may be any functional groups or substituents derived from an aliphatic hydrocarbon ring, or an any functional groups or substituents derived from an aromatic hydrocarbon ring. The number of ring-forming carbon atoms in the hydrocarbon ring group may be 5 to 60.

As used herein, a heterocyclic group may be any functional groups or substituents derived from a heterocycle containing at least one hetero atom as a ring-forming atom. The number of ring-forming carbon atoms in the heterocyclic group may be 5 to 60.

As used herein, an aryl group may be any functional groups or substituents derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include a phenyl group, a naphthyl group, a fluorenyl group, an anthracenyl group, a phenanthryl group, a biphenyl group, a terphenyl group, a quaterphenyl group, a quingphenyl group, a sexiphenyl group, a triphenylenyl group, a pyrenyl group, a benzofluoranthenyl group, a chrysenyl group, etc., but the exemplary embodiments are not limited thereto.

As used herein, a heteroaryl group may include at least one of B, O, N, P, Si, or S as a hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include a thiophene group, a furan group, a pyrrole group, an imidazole group, a thiazole group, an oxazole group, an oxadiazole group, a triazole group, a pyridine group, a bipyridine group, a pyrimidine group, a triazine group, a triazole group, an acridyl group, a pyridazine group, a pyrazinyl group, a quinoline group, a quinazoline group, a quinoxaline group, a phenoxazine group, a phthalazine group, a pyridopyrimidine group, a pyrido pyrazine group, a pyrazino pyrazine group, an isoquinoline group, an indole group, a carbazole group, an N-arylcarbazole group, an N-heteroarylcarbazole group, an N-alkylcarbazole group, a benzoxazole group, a benzoimidazole group, a benzothiazole group, a benzocarbazole group, a benzothiophene group, a dibenzothiophene group, a thienothiophene group, a benzofuran group, a phenanthroline group, a thiazole group, an isoxazole group, an oxazole group, an oxadiazole group, a thiadiazole group, a phenothiazine group, a dibenzosilole group, a dibenzofuran group, etc., but the exemplary embodiments are not limited thereto.

As used herein, the number of carbon atoms in an amine group is not particularly limited, but may be 1 to 30. The amine group may include an alkyl amine group and an aryl amine group. Examples of the amine group include a methylamine group, a dimethylamine group, a phenylamine group, a diphenylamine group, a naphthylamine group, a 9-methyl-anthracenylamine group, a triphenylamine group, etc., but the exemplary embodiments are not limited thereto.

Referring to FIG. 6A, the first ligand LD1 includes a first head HD1, an intermediate chain MCP, a functional group linker FGL, and two or more functional group chains FG.

The first head HD1 may include a functional group for bonding to a surface of the body EDM, in particular, a surface of the insulating film IL. In an exemplary embodiment, the first head HD1 may include at least one of a hydroxy group, a thiol group, a catechol group, a siloxane group, a phosphonic acid group, an amine group, or a carboxy group. The first head HD1 may include at least one functional group to be bonded to the surface of the insulating layer IL. For example, the first head HD1 may include one catechol group or carboxy group, or two hydroxy groups. For example, the first head HD1 may include a siloxane group or a phosphonic acid group.

The intermediate chain MCP is linked to the first head HD1, links the first head HD1 and the functional group linker FGL, and is selected to have an appropriate length such that the first ligand LD1 is formed to have an appropriate length. The intermediate chain MCP may be, for example, a substituted or unsubstituted alkyl group having 1 to 10 carbon atoms.

The functional group linker FGL may be linked to the other end END1 of the intermediate chain MCP, and may be a position where two or more functional group chains FG are linked. The functional group linker FGL may include an element for linking a plurality of functional group chains FG. In an exemplary embodiment, the functional group linker FGL may be a nitrogen atom.

Each of the two or more functional group chains FG may be linked to the functional group linker FGL, and the first ligand LD1 may be selected to have an appropriate length so as to ensure dispersibility in ink. The functional group chains FG may include a first functional group chain FG1 and a second functional group chain FG2. Each of the first functional group chain FG1 and the second functional group chain FG2 may be the same as or different from each other. In an exemplary embodiment, the first functional group chain FG1 and the second functional group chain FG2 are each, independently from one another, a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms.

The first ligand LD1 may be represented by Formula 1 below.

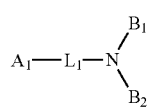

Formula 1

In Formula 1, A1 is a hydroxy group, a thiol group, a catechol group, a siloxane group, a phosphonic acid group, an amine group, or a carboxy group. For example, A1 may be a siloxane group or a phosphonic acid group.

L1 is a substituted or unsubstituted alkyl group having 1 to 10 carbon atoms. For example, L1 may be a substituted or unsubstituted propynyl group.

B1 and B2 are each, independently a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms. For example, B1 and B2 may both be substituted or unsubstituted ester groups.

The first ligand LD1 may be represented by Formula 1-1 or Formula 1-2 below.

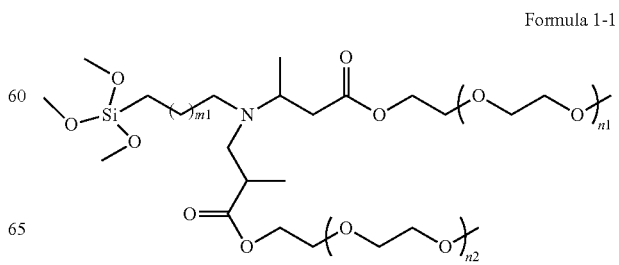

Formula 1-1

-continued

Formula 1-2

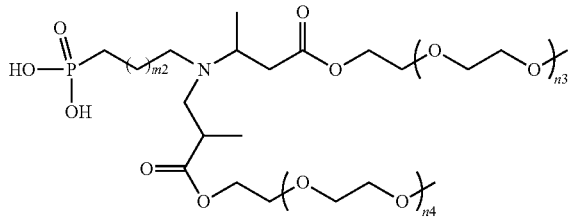

In Formulas 1-1 and 1-2, m1 and m2 are each independently an integer of 1 to 5, and n1 to n4 are each independently an integer of 1 to 10. The variables m1 and m2, and n1 to n4 satisfy the above range, the first ligand LD1 is bonded to the surface of the body EDM of the light emitting element ED to secure an effect of improving dispersibility in a solution.

Referring to FIG. 6B, the second ligand LD2 includes a second head HD2 and a chain CP. The second ligand LD2 may have a shorter carbon length of the chain forming a ligand than the first ligand LD1.

The second head HD2 may include a functional group for bonding to the surface of the body EDM, in particular, to the surface of the insulating film IL. In an exemplary embodiment, the second head HD2 may include at least any one of a hydroxy group, a thiol group, a catechol group, a siloxane group, a phosphonic acid group, an amine group, or a carboxy group. The second head HD2 may include at least one functional group to be bonded to the surface of the insulating layer IL. For example, the second head HD2 may include one catechol group or carboxy group, or two hydroxy groups. For example, the second head HD2 may include a siloxane group or a phosphonic acid group.

The second head HD2 may include a different functional group from the first head HD1. In an exemplary embodiment, as the first head HD1 and the second head HD2 each include different functional groups, each of the first ligand LD1 and the second ligand LD2 may be bonded to different bonding positions from each other in the surface of the body EDM. That is, the first ligand LD1 may be bonded to a first bonding position CS1, and the second ligand LD2 may be bonded to a second bonding position CS2.

The chain CP may be linked to the second head HD2, and the second ligand LD2 may be selected to have an appropriate length such that the second ligand LD2 is formed to have an appropriate length. The chain CP may include a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms. In an exemplary embodiment, the chain CP may include a substituted or unsubstituted second head HD2-linked alkyl group having 1 to 10 carbon atoms, a chalcogen atom linked to an alkyl group, and a substituted or unsubstituted ester group linked to a chalcogen atom.

The second ligand LD2 may be represented by Formula 2 below.

$$A_2\text{-}L_2\text{-}Y\text{—}B_3 \qquad \text{Formula 2}$$

In Formula 2, A2 is a hydroxy group, a thiol group, a catechol group, a siloxane group, a phosphonic acid group, an amine group, or a carboxy group. For example, A2 may be a siloxane group or a phosphonic acid group.

L2 is a substituted or unsubstituted alkyl group having 1 to 10 carbon atoms. For example, L2 may be a substituted or unsubstituted propynyl group.

Y is a chalcogen atom. For example, Y may be an oxygen atom or a sulfur atom.

B3 is a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms.

The second ligand LD2 may be represented by Formula 2-1 or Formula 2-2 below.

Formula 2-1

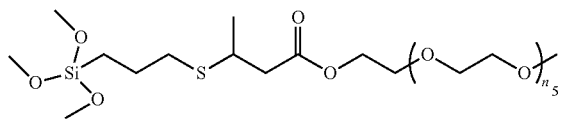

Formula 2-2

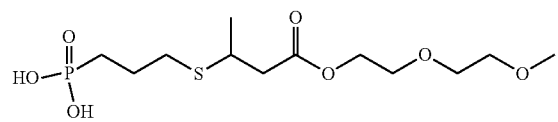

In Formulas 2-1 and 2-2 above, n5 is an integer of 1 to 5. A variable n5 satisfies the above range, the second ligand LD2 is bonded to a bonding position between the first ligands LD1 on the surface of the body EDM of the light emitting element ED to ensure an effect of improving dispersibility in a solution.

The light emitting element according to an exemplary embodiment of the invention includes a first ligand having two or more functional group chains, and a second ligand having a shorter carbon length than the first ligand. A first ligand including two or more functional group chains may be bonded to the body to improve dispersibility in ink, and a second ligand having a short carbon length may be bonded between the first ligands having large volume to increase the ligand substitution rate of the light emitting element, and further improve dispersibility in a solution. Accordingly, when the light emitting element dispersed in the solution is applied to a display device, the density of the light emitting element in the display device increases, and the reliability and manufacturing yield of the display device may be enhanced.

Figure 7:
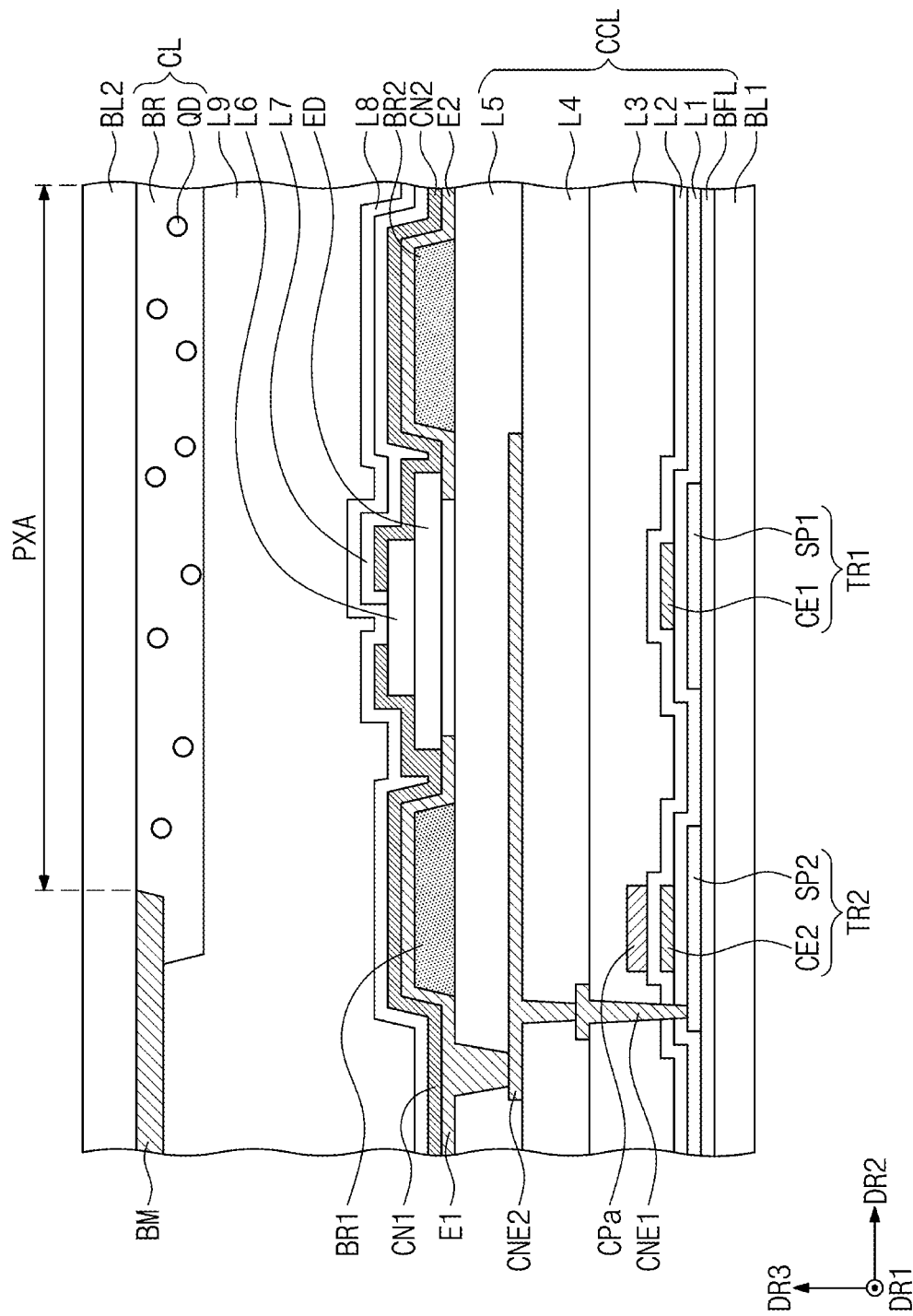
FIG. 7 is a cross-sectional view of an exemplary embodiment of a display device constructed according to the principles of the invention.

FIG. 7 is a cross-sectional view of an exemplary embodiment of a the display device constructed according to the principles of the invention. For ease of description, areas corresponding to one pixel are illustrated in FIG. 7 while some are omitted to avoid redundancy in the illustration.

Referring to FIG. 7, a first base layer BL1 and a second base layer BL2 may face each other. Each of the first base layer BL1 and the second base layer BL2 may have a stack structure including a silicon substrate, a plastic substrate, a glass substrate, an insulating film, or a plurality of insulating layers.

A circuit layer CCL may be disposed on the first base layer BL1. The circuit layer CCL may include a stack structure including a plurality of insulating layers, a plurality of transistors, and a plurality of electrodes. For example, the circuit layer CCL may include a buffer layer BFL, a first insulating layer L1, a first thin film transistor TR1, a second thin film transistor TR2, a second insulating layer L2, a third insulating layer L3, a fourth insulating layer L4, a first connection electrode CNE1, a second connection electrode CNE2, and a fifth insulating layer L5.

The buffer layer BFL may be disposed on the first base layer BL1. The first thin film transistor TR1 and the second thin film transistor TR2 may be disposed on the buffer layer BFL.

The first thin film transistor TR1 may include a first control electrode CE1 and a first semiconductor pattern SP1. The second thin film transistor TR2 may include a second control electrode CE2 and a second semiconductor pattern SP2. The first semiconductor pattern SP1 and the second semiconductor pattern SP2 each may include a doped region and a non-doped region. The doped region may be doped with an N-type dopant or a P-type dopant. Each of the first semiconductor pattern SP1 and the second semiconductor pattern SP2 may include a source, an active, and a drain. The non-doped region may substantially correspond to the active (or channel) of a transistor. In other words, a part of the semiconductor pattern may be the active of the transistor, and the other part may be the source or drain of the transistor. Each of the first thin film transistor TR1 and the second thin film transistor TR2 may further include an input electrode and an output electrode connected to the source and drain.

The first semiconductor pattern SP1 and the second semiconductor pattern SP2 may be disposed on the buffer layer BFL. The buffer layer BFL may provide a modified surface to the first semiconductor pattern SP1 and the second semiconductor pattern SP2. In this case, the first semiconductor pattern SP1 and the second semiconductor pattern SP2 may have higher adhesion to the buffer layer BFL than when directly formed on the first base layer BL1. In addition, the buffer layer BFL may be a barrier layer protecting lower surfaces of each of the first semiconductor pattern SP1 and the second semiconductor pattern SP2. In this case, the buffer layer BFL may prevent the first base layer BL1 itself, or contamination or moisture introduced through the first base layer BL1 from penetrating into the first semiconductor pattern SP1 and the second semiconductor pattern SP2.

The first insulating layer L1 may be disposed on the buffer layer BFL and may cover the first semiconductor pattern SP1 and the second semiconductor pattern SP2. The first insulating layer L1 may include an inorganic material. The inorganic material may be, for example, a silicon nitride, a silicon oxynitride, a silicon oxide, a titanium oxide, or an aluminum oxide, but the exemplary embodiments are not limited thereto.

The first control electrode CE1 and the second control electrode CE2 may be disposed on the first insulating layer L1. The second insulating layer L2 may be disposed on the first insulating layer L1 and may cover the first control electrode CE1 and the second control electrode CE2. The second insulating layer L2 may include an inorganic material.

A capacitor may include a first cap electrode and a second cap electrode CPa. For example, the first cap electrode may be branched from the second control electrode CE2, and the second cap electrode CPa may be disposed on the second insulating layer L2.

The third insulating layer L3 may be disposed on the second insulating layer L2, and may cover the second cap electrode CPa. The first connection electrode CNE1 may be connected to the second semiconductor pattern SP2 through through-holes penetrating through the first to third insulating layers L1, L2, and L3. The first connection electrode CNE1 may be connected to drain of the second semiconductor pattern SP2. A connection signal line connected to the drain of the second semiconductor pattern SP2 may be further included on the circuit layer CCL, the first connection electrode CNE1 may be connected to the connection signal line. Not only the first connection electrode CNE1, but also signal wires, for example, at least some of each of the scan lines or the data lines may be disposed on the third insulating layer L3.

The fourth insulating layer L4 may be disposed on the third insulating layer L3, and may cover the first connection electrode CNE1. The fourth insulating layer L4 may be a single layer or a plurality of layers, and the fourth insulating layer L4 may include an organic material and/or an inorganic material.

The second connection electrode CNE2 may be disposed on the fourth insulating layer L4. Not only the second connection electrode CNE2 but also signal wires, for example, at least some other of each of the scan lines or the data lines, may be disposed on the fourth insulating layer L4. The second connection electrode CNE2 may be connected to the first connection electrode CNE1.

The fifth insulating layer L5 may be disposed on the fourth insulating layer L4, and may cover the second connection electrode CNE2. The fifth insulating layer L5 may include an organic material. The fifth insulating layer L5 may cover a pixel circuit (see FIG. 2) to be disposed below, and may provide a generally flat surface.

A first barrier portion BR1 and a second barrier portion BR2 are disposed on the fifth insulating layer L5. Each of the first and second barrier portions BR1 and BR2 may extend in the first direction DR1. The second barrier portion BR2 may be spaced apart from the first barrier portion BR1 in the second direction DR2. The first barrier portion BR1 and the second barrier portion BR2 may include the same material. For example, the first barrier portion BR1 and the second barrier portion BR2 may include an organic material.

The first electrode E1 may be disposed on the first barrier portion BR1, and the second electrode E2 may be disposed on the second barrier portion BR2. The first electrode E1 may extend in the first direction DR1 and may cover the first barrier portion BR1, and the second electrode E2 may extend in the first direction DR1 and may cover the second barrier portion BR2. That is, the first barrier portion BR1 may be disposed between the first electrode E1 and the fifth insulating layer L5, and the second barrier portion BR2 may be disposed between the second electrode E2 and the fifth insulating layer L5.

A through-hole may be provided in the fifth insulating layer L5, and the second connection electrode CNE2 may be exposed by the through-hole. The first electrode E1 may be electrically connected to the second connection electrode CNE2 to be exposed. The second electrode E2 may be electrically connected to a power line. That is, a second power voltage ELVSS (see FIG. 2) may be provided in the second electrode E2.

Each of the first electrode E1 and the second electrode E2 may have a single layer structure or a plurality of stack structures. For example, each of the first electrode E1 and the second electrode E2 may include a reflection electrode and a capping electrode disposed on the reflection electrode. The reflection electrode may have a single layer structure or a plurality of stack structures. For example, the reflection electrode may have a structure in which an indium tin oxide (ITO), silver (Ag), and an indium tin oxide (ITO) are sequentially stacked. However, this is merely an example and the exemplary embodiments are not limited thereto. The capping electrode may cap the reflection electrode. The capping electrode may include at least any one of an indium zinc oxide (IZO), an indium tin oxide (ITO), an indium gallium oxide (IGO), an indium zinc gallium oxide (IGZO), or a mixture/compound thereof.

The light emitting element ED may be disposed on the fifth insulating layer L5. The light emitting element ED may be provided in plural, and light emitting elements provided in plural may be connected in parallel. An insulating pattern may be further disposed between the fifth insulating layer L5 and the light emitting element ED. The light emitting element ED may be electrically connected to the first electrode E1 and the second electrode E2.

A sixth insulating layer L6 or the insulating pattern may be disposed on the light emitting element ED. The sixth insulating layer L6 may cover at least a part of an upper surface of the light emitting element ED.

The light emitting element ED may be electrically connected to the first electrode E1 through a first element connection electrode CN1, and the light emitting element ED may be electrically connected to the second electrode E2 through a second element connection electrode CN2.

The second element connection electrode CN2 may be disposed on the light emitting element ED and the second electrode E2. A seventh insulating layer L7 may be disposed on the second element connection electrode CN2. The first element connection electrode CN1 may be disposed on the light emitting element ED and the first electrode E1. Even when the length of the light emitting element ED is several hundred micrometers or less, the second element connection electrode CN2 and the first element connection electrode CN1 may not be in direct contact with each other by the seventh insulating layer L7. However, this is merely an exemplary embodiment, and in another exemplary embodiment, the first element connection electrode CN1 and the second element connection electrode CN2 may be simultaneously formed through the same process. In some exemplary embodiments, the seventh insulating layer L7 may be omitted.

The first element connection electrode CN1 and the second element connection electrode CN2 may include a conductive material. For example, the conductive material may include at least any one of an indium zinc oxide (IZO), an indium tin oxide (ITO), an indium gallium oxide (IGO), an indium zinc gallium oxide (IGZO), or a mixture/compound thereof. However, the exemplary embodiments are not limited thereto. For example, the conductive material may be a metal material, and the metal material may include, for example, molybdenum (Mo), silver (Ag), titanium (Ti), copper (Cu), aluminum (Al), or an alloy thereof.

An eighth insulating layer L8 may be disposed on the first element connection electrode CN1, and the second element connection electrode CN2, and the seventh insulating layer L7. The eighth insulating layer L8 may be an encapsulation layer.

A light blocking layer BM may be disposed on one surface of the second base layer BL2 facing the first base layer BL1. An opening may be provided in the light blocking layer BM, and a wavelength converter CL may cover the opening. An area exposed by the opening may correspond to a pixel emission area PXA.

The wavelength converter CL may include a resin BR and a light emitter QD. The resin BR is a medium in which the light emitter QD is dispersed, and may be formed of various resin compositions, which may be generally referred to as a binder. However, the exemplary embodiments are not limited thereto, and as long as the medium is capable of dispersing the light emitter QD, the medium may be referred to as a base resin regardless of names, additional functions, constituent materials, etc. The base resin may be a polymer resin. For example, the base resin may be an acrylic-based resin, a urethane-based resin, a silicone-based resin, an epoxy-based resin, etc. The base resin may be a transparent resin.

The light emitter QD may absorb first light provided from the light emitting element ED, and may convert the wavelength of the first light to emit second color light which is different from the first light in color. The light emitter QD may be, for example, a quantum dot. The first light may be blue light, and the second color light may be green light or red light.

A quantum dot has a crystalline structure of a few nanometers in size, contains hundreds to thousands of atoms, and exhibits a quantum confinement effect in which an energy band gap is increased due to its small size. When light of a wavelength having higher energy than the band gap is incident on the quantum dot, the quantum dot absorbs the light to be excited, and falls to a ground state while emitting light of a specific wavelength. The emitted light of the specific wavelength has a value corresponding to the band gap. When the quantum dot is adjusted in size and composition, light emitting properties due to the quantum confinement effect may be controlled.

The quantum dot may have a core-shell structure including a core and a shell surrounding the core. Also, the quantum dot may have a core-shell structure in which one quantum dot surrounds another quantum dot. The interface between the core and the shell may have a concentration gradient where the concentration of an element in the shell decreases closer to the center.

A quantum dot may be a particle having a nanometer-scaled size. The quantum dot may have a full width of half maximum (FWHM) of a light emitting wavelength spectrum of about 45 nm or less, preferably about 40 nm or less, more preferably about 30 nm or less, and color purity or color reproducibility may be improved in the above range. In addition, light emitted through such a quantum dot is emitted in all directions, and thus a wide viewing angle may be improved.

In addition, although the form of a quantum dot is not particularly limited as long as it is a form commonly used in the art, more specifically, a quantum dot in the form of generally spherical, generally pyramidal, generally multi-armed, or generally cubic nanoparticles, generally shaped nanotubes, generally shaped nanowires, generally shaped nanofibers, generally shaped nanoparticles, etc. may be used.

In another exemplary embodiment, the wavelength converter CL may be replaced with a color filter. The color filter may implement colors by absorbing light of a specific wavelength. In another exemplary embodiment, the wavelength converter CL may be omitted. In this case, the light emitting element ED may emit blue light, green light, or red light. In addition, in another exemplary embodiment, the display device DD may further include a color filter layer disposed between the wavelength converter CL and the second base layer BL2.

A ninth insulating layer L9 may be disposed between the wavelength converter CL and the eighth insulating layer L8. For example, the first base layer BL1 on which a pixel circuit and the light emitting element ED are disposed, and the second base layer BL2 on which the wavelength converter CL and the light blocking layer BM are disposed may be bonded by the ninth insulating layer L9. For example, the ninth insulating layer L9 may be a filler, an optically clear adhesive film, an optically clear resin, or a pressure sensitive adhesive film. However, this is merely an example, and in another exemplary embodiment, the ninth insulating layer L9 may be omitted. In this case, a predetermined cell gap may be provided between the wavelength converter CL and the eighth insulating layer L8.

Figure 8:
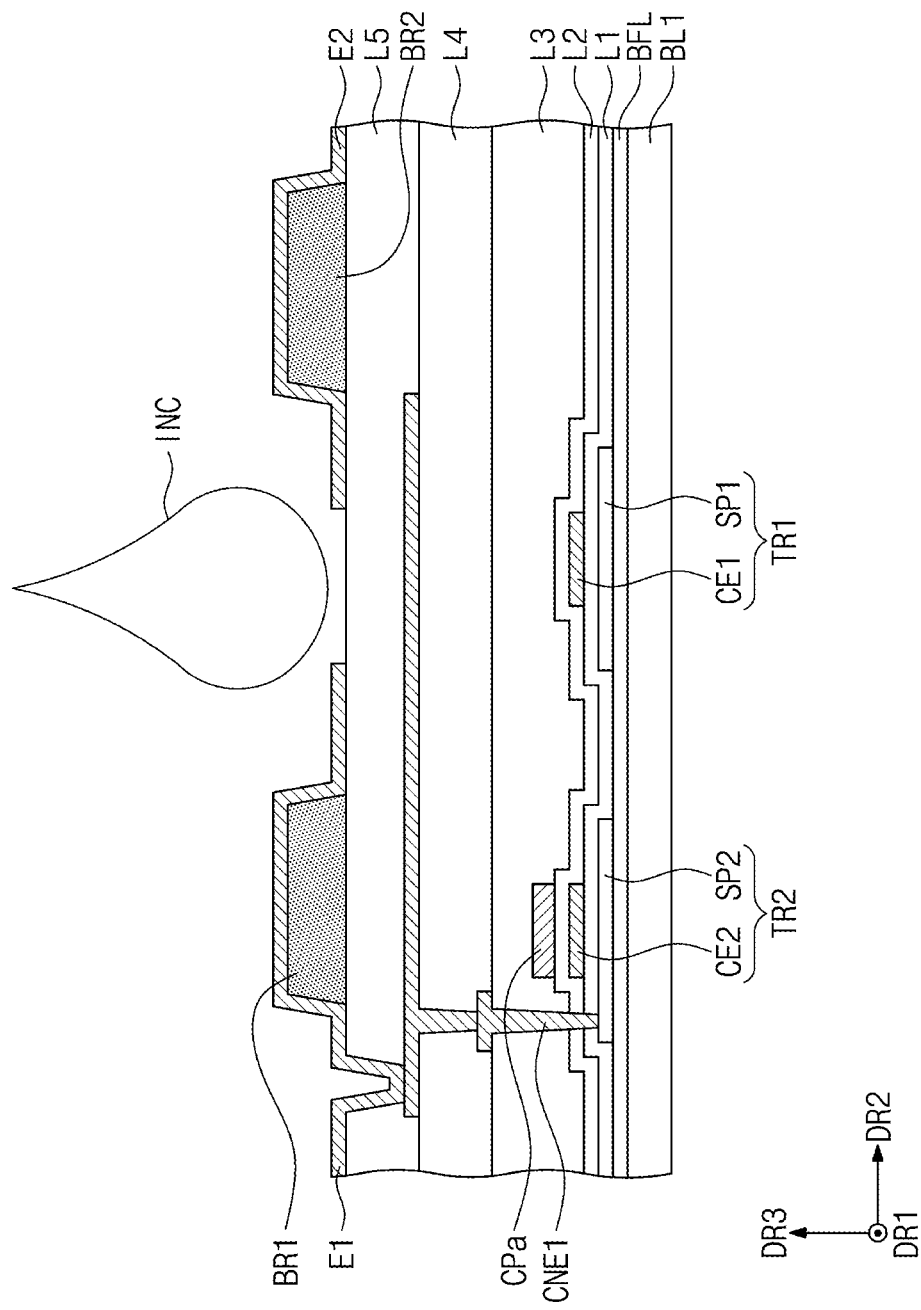
FIG. 8 is a cross-sectional view illustrating an exemplary embodiment of some steps in a method for manufacturing the display device of FIG. 7.
Figure 9:
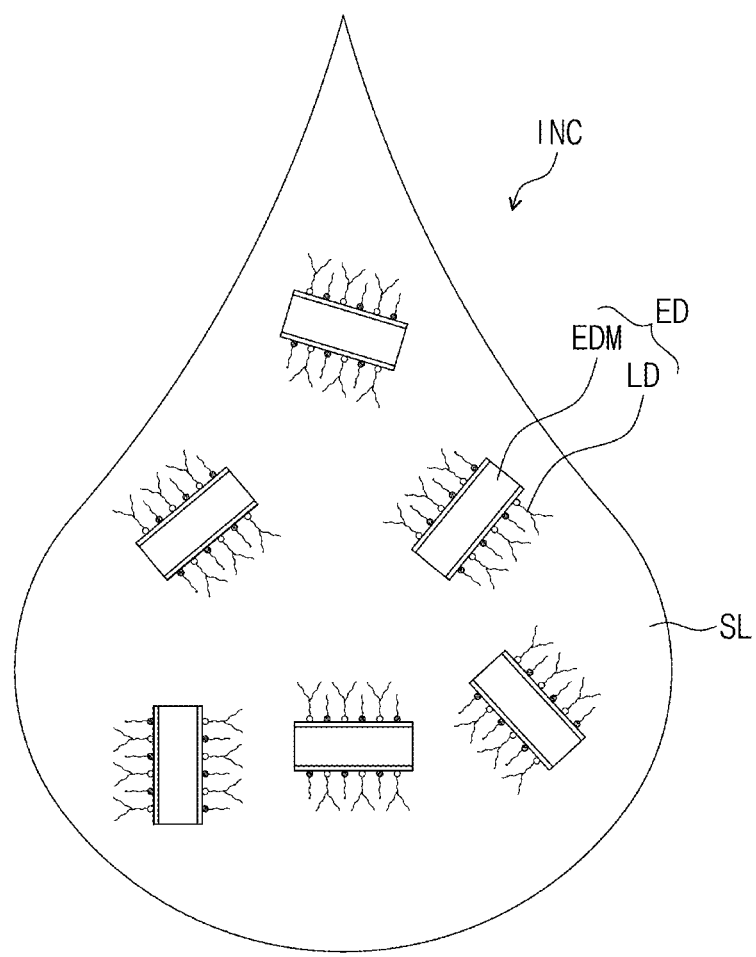
FIG. 9 is a schematic view illustrating an enlarged part of FIG. 8.

FIG. 8 is a cross-sectional view illustrating an exemplary embodiment of some steps in a method for manufacturing the display device of FIG. 7. FIG. 9 is a schematic view illustrating an enlarged part of FIG. 8. Hereinafter, a method for manufacturing a display device according to an exemplary embodiment will be described with reference to FIGS. 8 and 9. Elements illustrated above in FIGS. 1 to 7 are given the same reference numerals and repetitive descriptions thereof will be omitted to avoid redundancy.

A method for manufacturing a display device according to an exemplary embodiment includes disposing a circuit layer CCL (see FIG. 7) on a base layer BL1 and forming a first electrode E1 and a second electrode E2 on the circuit layer CCL. The method for manufacturing a display device according to an exemplary embodiment includes providing a solution INC including a plurality of light emitting elements ED and a solvent SL on the formed first electrode E1 and second electrode E2. The plurality of light emitting elements ED are included in the solution INC and provided on the first electrode E1 and the second electrode E2, and then aligned to be connected to the first electrode E1 and the second electrode E2 after the solvent SL is vaporized. In an exemplary embodiment, the solvent SL in which the plurality of light emitting elements ED are dispersed may be water-soluble.

Each of the plurality of light emitting elements ED may include a body EDM and at least one ligand LD. Hereinafter, the same descriptions on the light emitting element ED of the exemplary embodiment described above in FIGS. 5A and 5B will be applied to descriptions on the light emitting element ED. That is, the light emitting element ED may include a first ligand LD1 and a second LD2 ligand having different carbon lengths from each other.

The light emitting element may include a body and a ligand bonded to the body, and includes a first ligand including two or more functional group chains, and a second ligand having a shorter carbon length than the first ligand. When the light emitting element according to an exemplary embodiment is dissolved in a water-soluble solvent and is provided on an electrode of a display device in a solution state, in the light emitting element of an exemplary embodiment, the first ligand including two or more functional group chains may be bonded to the body to enhance dispersibility in ink, and the second ligand having a shorter carbon length may be bonded to the body between the first ligands having large volume to further enhance dispersibility in the solution. In particular, as the first ligand having a long length and a plurality of functional group chains and the second ligand having smaller volume are bonded together, the ligand substitution rate of the light emitting element increases, and sufficient dispersibility in the water-soluble solvent may be secured. Accordingly, when the solution including a plurality of light emitting elements is provided on the electrode of the display device, the light emitting elements dispersed in the solution may be substantially uniformly aligned in the electrode, thereby improving manufacturing yield and reliability of the display device.

According to principles and exemplary embodiments of the invention, two types of ligands each having different lengths are bonded to a surface of a light emitting element body, and thus the surface of the light emitting element may be modified to increase dispersibility in water-soluble ink when the light emitting element is applied to a display device, thereby increasing manufacturing yield and product reliability.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A light emitting element comprising:
a member including a semiconductor layer and an active layer; and
at least one ligand bonded to a surface of the member;
wherein the at least one ligand comprises:
a first ligand including two or more functional group chains; and
a second ligand having a shorter carbon length than the first ligand.

2. The light emitting element of claim 1, wherein the member comprises a body, and the first ligand comprises:
a first head bonded to the surface of the body;
an intermediate chain linked to the first head;
a functional group linker linked to an end of the intermediate chain; and
the two or more functional group chains linked to the functional group linker, and
the second ligand comprises:
a second head bonded to the surface of the body; and
a chain linked to the second head.

3. The light emitting element of claim 2, wherein the first head and the second head each, independently from one another, comprise at least one of a hydroxy group, a thiol group, a catechol group, a siloxane group, a phosphonic acid group, an amine group, or a carboxy group.

4. The light emitting element of claim 2, wherein the chain and the two or more group chains each, independently from one another, comprise a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to ring-forming carbon atoms.

5. The light emitting element of claim 1, wherein the first ligand is represented by Formula 1 below:

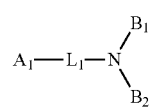

Formula 1 wherein in Formula 1 above,
A1 is a hydroxy group, a thiol group, a catechol group, a siloxane group, a phosphonic acid group, an amine group, or a carboxy group,
L1 is a substituted or unsubstituted alkyl group having 1 to 10 carbon atoms, and B1 and B2 are each, independently from one another, a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms.

6. The light emitting element of claim 5, wherein the first ligand is represented by Formula 1-1 or Formula 1-2 below:

Formula 1-1

Formula 1-2 wherein in Formulas 1-1 and 1-2 above, m1 and m2 are each independently an integer of 1 to 5, and n1 to n4 are each independently an integer of 1 to 10.

7. The light emitting element of claim 1, wherein the second ligand is represented by Formula 2 below:

$$A_2\text{-}L_2\text{-}Y\text{—}B_3 \qquad \text{Formula 2}$$

wherein in Formula 2 above,

A2 is a hydroxy group, a thiol group, a catechol group, a siloxane group, a phosphonic acid group, an amine group, or a carboxy group, L2 is a substituted or unsubstituted alkyl group having 1 to 10 carbon atoms, Y is O or S, and B3 is a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms.

8. The light emitting element of claim 7, wherein the second ligand is represented by Formula 2-1 or Formula 2-2 below:

Formula 2-1

Formula 2-2 wherein in Formulas 2-1 and 2-2 above, n5 is an integer of 1 to 5.

9. The light emitting element of claim 1, wherein the semiconductor layer comprises a first semiconductor layer, and a second semiconductor layer spaced apart from the first semiconductor layer with the active layer therebetween.

10. The light emitting element of claim 9, wherein the member further comprises a first contact electrode disposed adjacent to the first semiconductor layer, and a second contact electrode disposed adjacent to the second semiconductor layer.

11. The light emitting element of claim 1, wherein the member further comprises an insulating film covering side portions of the semiconductor layer and the active layer, and a metal oxide.

12. The light emitting element of claim 11, wherein the ligand is bonded to the insulating film.

13. The light emitting element of claim 1, wherein the member comprises a body having a plurality of first bonding positions to which the first ligand is bonded, and a plurality of second bonding positions to which the second ligand is bonded, wherein at least any one of the plurality of second bonding positions is disposed between a pair of adjacent first bonding positions of the plurality of first bonding positions.

14. The light emitting element of claim 1, wherein the length of the body is about 1 μm to about 100 μm.

15. A ligand for a light emitting element, the ligand comprising:

a head;

an intermediate chain linked to the head;

a functional group linker linked to an end of the intermediate chain; and two or more functional group chains linked to the functional group linker, wherein the two or more functional group chains each, independently from one another, comprise a substituted or unsubstituted amine group, a substituted or unsubstituted oxy group, a substituted or unsubstituted thio group, a substituted or unsubstituted ester group, a substituted or unsubstituted amide group, a substituted unsubstituted alkyl group having 1 to 20 carbon atoms, or a substituted or unsubstituted aryl group having 6 to 30 ring-forming carbon atoms.

16. The ligand of claim 15, wherein the ligand is represented by Formula 1 below:

Formula 1

$$A_1\text{—}L_1\text{—}N\begin{smallmatrix}B_1\\ \\B_2\end{smallmatrix}$$

wherein in Formula 1 above,

A1 is a hydroxy group, a thiol group, a catechol group, a siloxane group, a phosphonic acid group, an amine group, or a carboxy group, L1 is a substituted or unsubstituted alkyl group having 1 to 10 carbon atoms, and B1 and B2 are each, independently from one another, a substituted or unsubstituted amine group, a substituted or unsubstituted oxy group, a substituted or unsubstituted thio group, a substituted or unsubstituted ester group, a substituted or unsubstituted amide group, a substituted or unsubstituted alkyl group having 1 to 20 carbon atoms, or a substituted or unsubstituted aryl group having 6 to 30 ring-forming carbon atoms.

17. The ligand of claim 15, wherein the ligand is represented by Formula 1-1 or Formula 1-2 below:

Formula 1-1

Formula 1-2 wherein in Formulas 1-1 and 1-2 above, m1 and m2 are each, independently from one another, an integer of 1 to 5, and n1 to n4 are each, independently from one another, an integer of 1 to 10.

18. A method for manufacturing a display device, the method comprising the steps of:
    forming a circuit layer on a base layer;
    forming a first electrode and a second electrode on the circuit layer;
    providing a plurality of light emitting elements and a solution comprising a solvent on the first electrode and the second electrode; and
    vaporizing the solvent,
    wherein each of the plurality of light emitting elements comprises:
    a member having a semiconductor layer and an active layer; and
    at least one ligand bonded to a surface of the member, and the at least one ligand comprises:
    a first ligand having two or more functional group chains, and
    a second ligand having a shorter carbon length than the first ligand.

19. The method of claim 18, wherein the solvent is at least substantially water-soluble.

20. The method of claim 18, wherein the two or more functional group chains each, independently from one another, comprise a substituted or unsubstituted amine group, a substituted or unsubstituted oxy group, a substituted or unsubstituted thio group, a substituted or unsubstituted ester group, a substituted or unsubstituted amide group, a substituted unsubstituted alkyl group having 1 to 20 carbon atoms, or a substituted or unsubstituted aryl group having 6 to 30 ring-forming carbon atoms.

* * * * *